United States Patent
Gattuso et al.

(10) Patent No.: US 6,827,599 B1
(45) Date of Patent: Dec. 7, 2004

(54) IC SOCKET HAVING URGING MECHANISM

(75) Inventors: Andrew D. Gattuso, Phoenix, AZ (US); Hsiu-Yuan Hsu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/819,682

(22) Filed: Apr. 6, 2004

(51) Int. Cl.[7] ................................................ H01R 4/50
(52) U.S. Cl. ..................................................... 439/342
(58) Field of Search ................................ 439/259, 263, 439/264, 268, 342

(56) References Cited

U.S. PATENT DOCUMENTS 5,823,794 A * 10/1998 Abe .............................. 439/73
6,383,002 B1 * 5/2002 Ohashi ....................... 439/259
6,439,896 B2 * 8/2002 Mori ............................ 439/73
6,638,091 B2 * 10/2003 Yamagishi ................... 439/331

* cited by examiner

Primary Examiner—Thanh-Tam Le
(74) Attorney, Agent, or Firm—Wei Te Chung

(57) ABSTRACT

An socket (20) includes a base (30), a cover (50) slidably mounted on the base, a lid (60) attached to the base by plates (70A). The cover has guiding protrusions (56A) mated with guiding grooves (72A) of the plates, respectively. The guiding grooves each include first and second parts (705A, 707A) communicated smoothly with each other. A center line of the first part departs radially offsetly from a center point of the plate so that either of opposite sides of the first part can urge the guiding protrusion therein to make the cover move relative to the base between open and close positions. A center line of the second part has an arc shape whose center point is the center point. Thus, neither of opposite sides of the second part can actuate the guiding protrusion and the cover is kept immovable in the close position when the lid is over-urged.

4 Claims, 4 Drawing Sheets

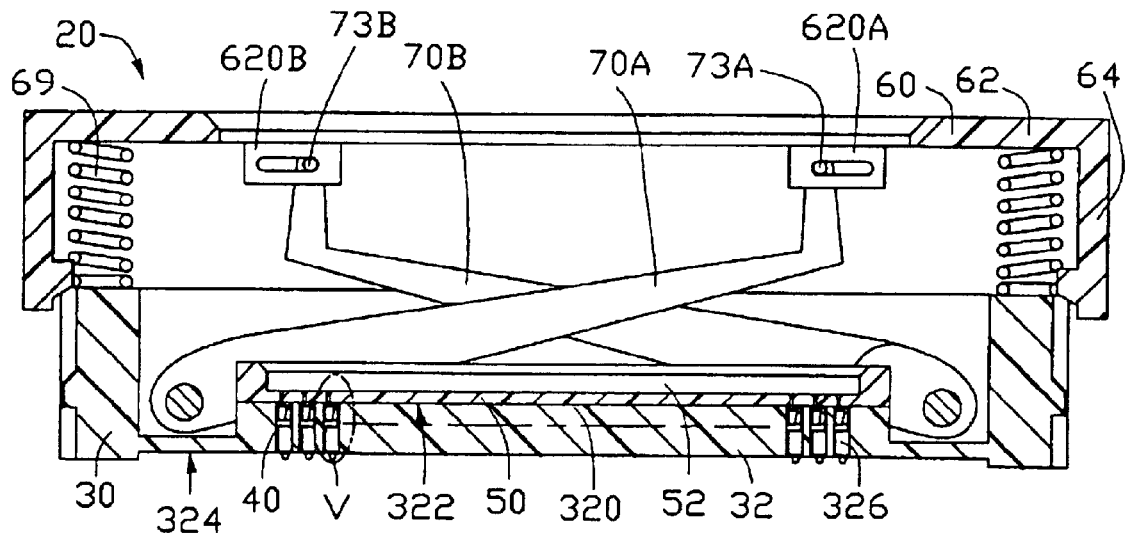
FIG. 4
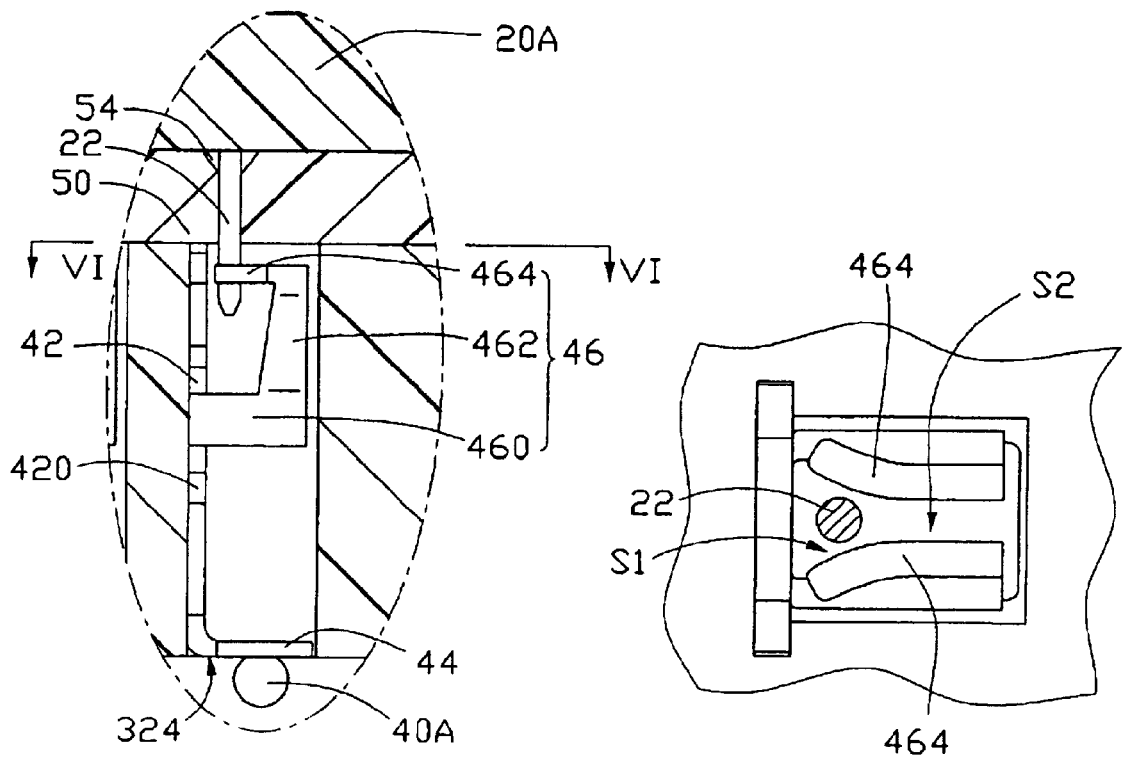
FIG. 5
FIG. 6

US 6,827,599 B1

IC SOCKET HAVING URGING MECHANISM

BACKGROUND OF THE INVENTION

1. Field of the Invention

This invention relates to an integrated circuit (IC) socket for engaging and disengaging an IC loaded thereon, by moving a moving plate.

2. Description of the Prior Art

At present, an IC socket is widely used for electrically interconnecting an IC such as a central processing unit (CPU), with a electrical substrate such as a printed circuit board (PCB), for it is economical and convenient to re-place a new IC in the case of malfunction of the IC.

A typical IC socket includes a base, a plurality of terminals received in the base, a cover slidably mounted on the base, a lid attached to the base by transferring members. The transferring members are also attached to the cover. When the lid is continuously lifted up or pressed downwardly, the transferring members are continuously actuated to urge movement of the cover relative to the base between an open position where the terminals disengage corresponding leads of an IC, and a close position where the terminals engage said corresponding leads. Therefore, when the lid is unduly over-pressed downwardly, the terminals over-engage said corresponding leads. This is prone to result in damage to the terminals, the leads or both, especially when the leads each have a cantilever pin configuration and the terminals each have a mating cantilever arm configuration adapted to engage a corresponding pin.

Accordingly, a new IC socket is desired in light of the above problems.

SUMMARY OF THE INVENTION

An object of the present invention is to provide an IC socket able to avoid damage to the IC socket even when a lid of the IC socket is over-urged.

To attain the above object, an IC socket is applied according to a preferred embodiment of the present invention. The IC socket includes a dielectric base, a plurality of terminals received in the base, a cover slidably mounted on the base, and a lid attached to the base by plates. Guiding protrusions are formed on opposite sides of the cover. Correspondingly, guiding grooves are respectively defined in the plates, for engagingly receiving the guiding protrusions respectively. The guiding grooves each include first and second parts smoothly communicated with each other. A center line of the first part departs radially offsetly from a center point around which the plate rotates relative to the base, thereby either of opposite sides of the first part urges the guiding protrusion therein to make the cover move relative to the base between open and close positions. A center line of the second part has an arc shape whose center point is said center point. Thus, neither of opposite sides of the second part actuates the guiding protrusion and the cover is kept immovable in the close position when the lid is over-urged downwardly. Thereby reliability of electrical connection between the terminals and corresponding leads of an IC is assured.

Other objects, advantages and novelty features of this invention will become more apparent from the following detailed description taken in connection with the companying drawings.

BRIEF DESCRIPTION OF THE DRAWINGS

The features of the invention which are believed to be novel are set forth with particularity in the appended claims. The invention, together its objects and the advantages thereof, may be best understood by reference to the following detail description taken in junction with the accompanying drawings, in which like reference numerals identify like elements and in which:

FIG. 4 is similar to FIG. 1, but showing terminals of the IC socket received in a housing of the IC socket;

FIG. 5 is an enlarged view of a circled portion IV—IV of FIG. 4; showing a lead of an IC inserted in a corresponding terminal-passageway of the housing and ready to engage a corresponding terminal received in said terminal-passage;

FIG. 6 is a partial, cross section view taken along a line VI—VI of FIG. 5;

DETAILED DESCRIPTION OF PREFERRED EMBODIMENT OF THE INVENTION

Reference will now be made to the drawings to describe the present invention in detail.

Figure 1:
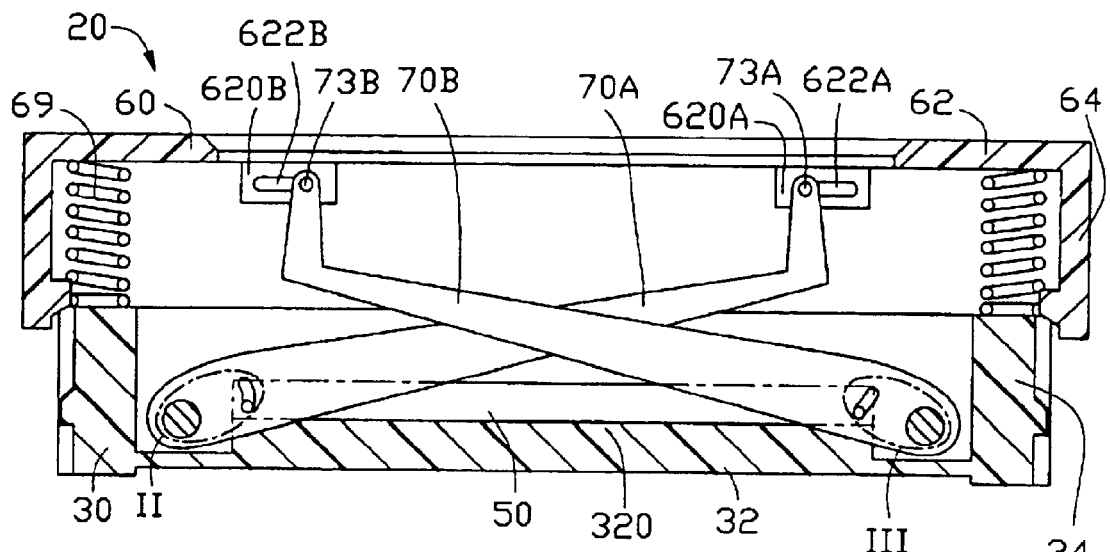
FIG. 1 is an assembled, cross-sectional view of an IC socket according to the present invention, showing the IC socket at an open situation.

Referring to FIG. 1, an IC socket 20 is applied according to a preferred embodiment of the present invention. The IC socket 20 is mainly used for electrically interconnecting an electrical device, such as an IC 20A (best seen in FIG. 5), with an electrical substrate, such as a printed circuit board (PCB), and more especially for testing an IC package by a testing board. It should also be understood that the IC socket 20 of this invention can be used in other environments that need it to establish electrical connection between electronic components.

Referring also to FIG. 4, the socket 20 includes a base 30, a plurality of terminals 40 secured in the base 30, a cover 50 horizontally slidably mounted on the base 30, a lid 60 vertically movably attached to the base 30 by first and second plates 70A, 70B.

The base 30 is molded from dielectric material, and has a parallelepiped configuration with a bottom wall 32 and side walls 34 extending upwardly from edges of the bottom wall 32. A protruding platform 320 projects upwardly from a top of the bottom wall 32, with an upper surface 322 for supporting the cover 50. A lower surface 324 is formed on the bottom wall 32, for being mounted on the PCB. A rectangular array of terminal-passageways 326 is defined in the bottom all 32 between the upper surface 322 and the lower surface 324, for receiving corresponding terminals 40 therein.

Figure 2:
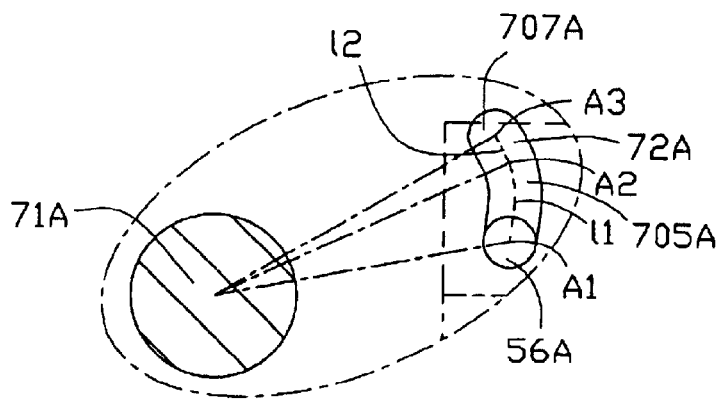
FIG. 2 is an enlarged view of a circled portion II—II of FIG. 1.
Figure 3:
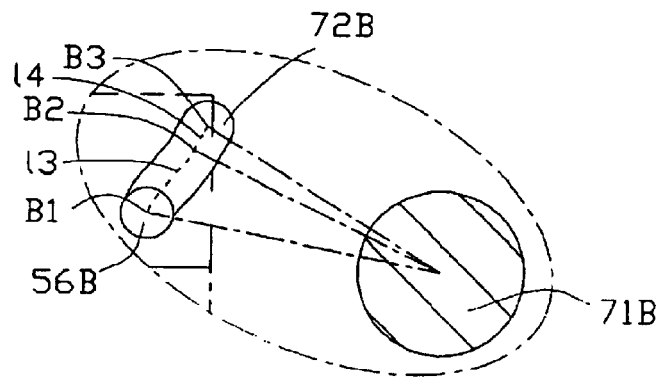
FIG. 3 is an enlarged view of a circled portion III—III of FIG. 1.
Figure 7:
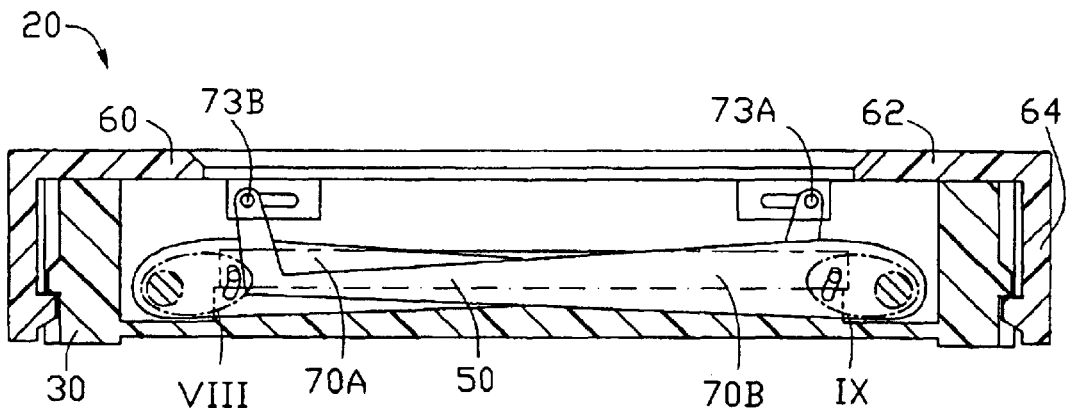
FIG. 7 is similar to FIG. 1, but showing the IC socket at a close situation.
Figure 8:
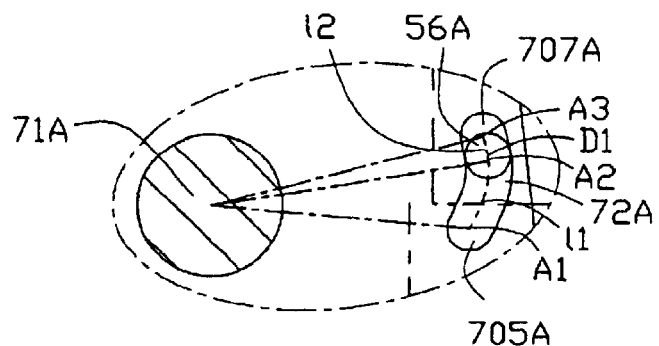
FIG. 8 is an enlarged view of a circled portion VIII—VIII of FIG. 7.
Figure 9:
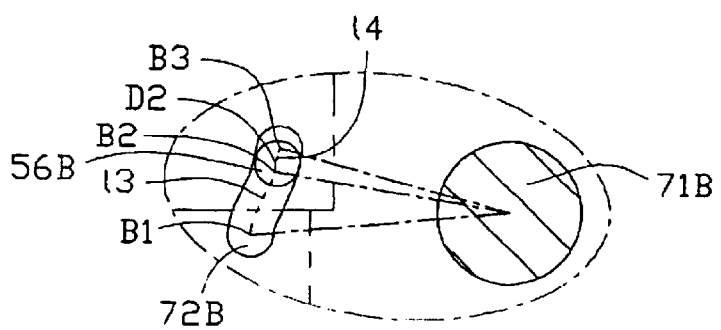
FIG. 9 is an enlarged view of a circled portion IX—IX of FIG. 7.

Referring to FIGS. 1, 2 and 3, first and second long pins 71A, 71B are assembled to side walls (not shown), for attaching the first and second plates 70A, 70B to the base 30.

Each of the pins 71A, 71B has a round section configuration engagingly received in a corresponding round hole defined in the plates 70A, 70B, thereby the plates 70A, 70B can rotate around axes of the pins 71A, 71B, respectively.

Referring to FIGS. 4 and 5, the cover 50 is formed from dielectric material, and has rectangular configuration mounted on the upper surface 322 of the base 30. A cell 52 is defined in the cover 50, for receiving the IC package 20A therein. Tapered surfaces are formed on the cover 50 at a mouth of the cell 52, for facilitating insertion of the IC package 20A into the cell 52. A plurality of holes 54 is defined in the cover 50, under the cell 52 and in communication therewith. Each hole 54 is aligned with a corresponding terminal-passageway 326, for insertion of a lead 22 of the IC package 20A into the terminal-passageway 326.

Referring best to FIG. 4, the lid 60 has a top body 62 and side legs 64 depending perpendicularly from edges of the top body 62. First and second depending blocks 620A, 620B extend from a bottom of the top body 62. First and second horizontal slots 622A, 622B are respectively defined in the first and second depending blocks 620A, 620B, for receiving corresponding first and second posts 73A, 73B respectively provided on the first and second plates 70A, 70B. Thereby the lid 60 is attached to the base 30 by the plates 70A, 70B. The slots 622A, 622B are long enough so that the posts 73A, 73B can horizontally freely move therein respectively as the plates 70A, 70B rotate around corresponding pins 71A, 71B.

Referring to FIGS. 5 and 6, each terminal 40 is stamped from a conductive material, and has a retention portion 42, a connecting section 44 extending perpendicularly from a lower end of the retention portion 42, a pair of arms 46 extending horizontally from middles of opposite sides of the retention portion 42. A soldering ball 40A is provided on a bottom of the connecting portion 44, for electrically attaching to the PCB.

Each arm 46 is formed with a first horizontal section 460, a vertical portion 462 upwardly and slantwise extending from a distal end of the first horizontal section 460, and a second horizontal section 464 extending horizontally extending from a distal end of the vertical section 462.

Two second horizontal sections 464 have their distal ends extended horizontally apart away from each other. Therefore, a receiving space S1 and a contacting space S2 are defined between the second horizontal sections 464. A span of the receiving space S1 is larger than a diameter of the lead 22 of the IC package 20A, thereby to facilitate insertion of the lead 22 therein. A width of the contacting space S2 is smaller than the diameter of the lead 22, for engagement of the lead 22 with inner sides of the second horizontal sections 464.

A plurality of barbs 420 is formed on opposite sides of the retention portion 42, for interveningly engaging inner sides of a corresponding terminal-passageway 263. The terminal 40 can, thereby, safely be secured in the terminal-passageway 263.

Referring back to FIGS. 1, 2 and 3, in order to attach the first and second plates 70A, 70B to the cover 50, attaching means is provided according to the present invention. In the preferred embodiment, said attaching means includes first and second guiding posts 56A, 56B formed on the cover 50, and first and second guiding grooves 72A, 72B defined respectively in the first and second plates 70A, 70B to receive the first and second guiding posts 56A, 56B therein respectively. Though in FIGS. 1 and 4, the first and second guiding posts 56A, 56B are only shown on one side of the cover 50, it should be understood that the first and second guiding posts 56A, 56B should be symmetrically formed on opposite sides of the cover 50, thereby said attaching means steadily attaches the first and second plates 70A, 70B to the cover 50. One first post 56A is correspondingly received in one first groove 72A and one second post 56B is correspondingly received in one second groove 72B.

The first guiding groove 72A has a uniform width somewhat wider than a diameter of the first guiding post 56A, and a length longer than said diameter, to the extend that the first guiding post 56A can continuously and smoothly be guided to move in the first guiding groove 72A, with opposite sides of the first guiding groove 72A abutting against the first guiding post 56A as the lid 60 is continuously lifted up or pressed downwardly. The same dimension design applies to the second guiding groove 72B and the second guiding post 56B. The second guiding post 56B can continuously and smoothly move in corresponding second guiding groove 72B, opposite sides of the second guiding groove 72B touching the first guiding post 56A as the lid 60 is continuously lifted up or pressed downwardly.

In the preferred embodiment, The first groove 70A further includes first and second sections 705A, 707A that smoothly communicate with each other. A center line 11 of the first section 705A starts from point A1 and ends at point A2. A center line 12 of the second section 707A is from point A2 to point A3.

Figure 10:
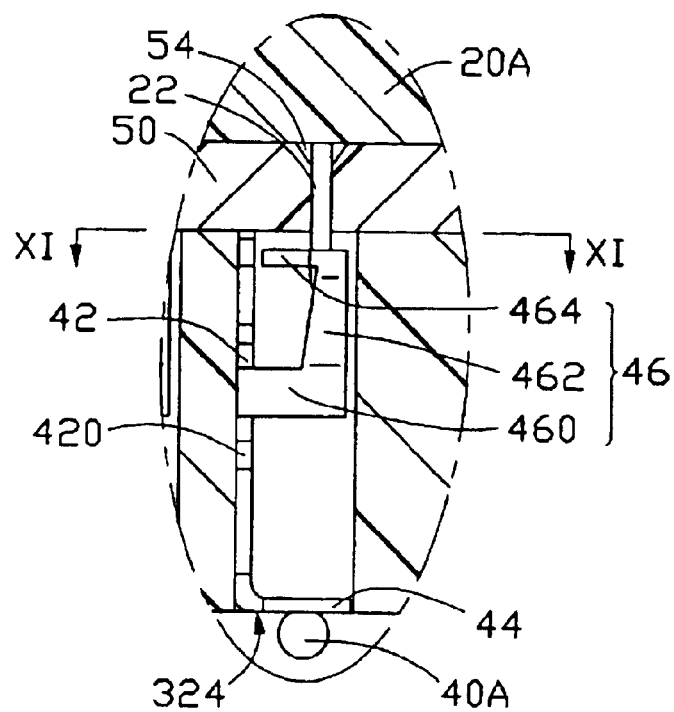
FIG. 10 is similar to FIG. 5, but showing the lead engaging the terminal.
Figure 11:
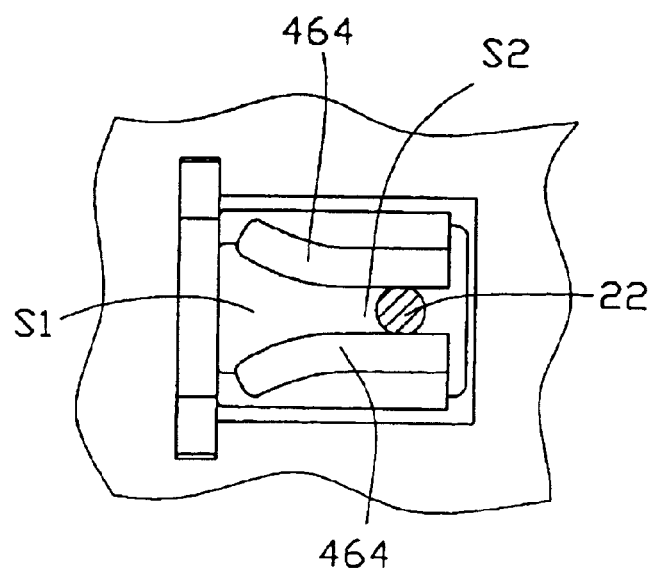
FIG. 11 is a partial, cross section view taken along a line XI—XI of FIG. 10.

The line 11 is charactered in that from point A1 to A2, the line 11 departs gradually and radially offsetly from a center point of the pin 71A in a plane vertical to a axis of the pin 71A. The whole offset distance is dimensioned just equal to a distance that the cover 50 moves on the base 30 between an open situation (best seen in FIGS. 5 and 6), where one terminal 40 completely disengages a corresponding lead 22 of the IC package 20A, and a close situation (best seen in FIGS. 10 and 11), where the terminal 40 fully engages said lead 22.

The line 12 is a regular circle, with said center point of the pin 71A as the center of the circle. Thereby any point of the line 12 has an equal distance to said center point of the pin 71A.

As best shown in FIGS. 1, 4 and 5 in assembly, the terminals 40 are secured in corresponding terminal-passageways 326 of the base 30, the barbs 420 of the retention portions 42 interveningly engagingly intervening inner sides of the terminal-passageways 326 and leaving the soldering balls 40A beyond the lower surface 324 of the base 30.

The cover 50 is mounted on the upper surface 322 of the base 30. To prevent the cover 50 from vertical displacement relative to the base 30, known latches (not shown) can be applied on the cover 50 and the base 30, such as that hooks formed on the cover 50 snappingly engage on blocks formed on the base 30.

The first and second pins 71A, 71B are inserted the holes of the first and second plates 71A, 71B and the sidewalls, thereby the plates 71A, 71B are pivoted to the base 30. Simultaneously, the first and second guiding posts 56A, 56B respectively project into the first and second guiding grooves 72A, 72B and the first and second posts 73A, 73B are respectively fixed in the first and second slots 622A, 622B of the lid 60. Thus, the IC socket 20 is assembled together.

To urge the lid 60 back to the open position when no force is applied thereon, spring means are provided between the base and the lid. In the preferred embodiment, the spring means is coil springs 69 fixed on the top body 62 of the lid 60 and tops of the sidewalls 34. After the IC socket 20 is assembled, the coil springs 69 is in a pressed state even if the lid 60 is orientated at the open position.

Referring to FIGS. 4, 5, 6, 10 and 11, in use, the IC socket 20 is kept at the open position. The IC package 20A is placed in the cell 52 of the cover 50, each lead 22 of the IC package 20A extending into the receiving space S1 of a corresponding terminal 40 through a corresponding hole 54 of the cover 50. A heat sink (not shown) touches on a top surface of the IC package 20A, to dissipate heat generated from the IC package 20A in work. The lid 60 is continuously pressed downwardly until the cover 50 reaches the close position, where the lead 22 fully engages said corresponding terminal 40 in the contacting space S2 of the terminal 40.

Referring also to FIGS. 2, 3, 8 and 9, in urging, the first and second plates 70A, 70B are actuated to respectively rotate round the first and second pins 71A, 71B as the lid 60 moves down, the first and second guiding grooves 72A, 72B respectively rotating round the first and second pins 71A, 71B and the first and second posts 73A, 73B sliding in the slots 622A, 622B. Thereby the first and second guiding posts 56A, 56B continuously slide in the first and second guiding grooves 72A, 72B respectively.

Since the center line 11 of the first section 705A, from point A1 to A2, departs gradually and radially offsetly from the center point of the first pin 71A in the plane vertical to the axis of the first pin 71A, and the whole offset distance is just equal to the distance that the cover 50 moves on the base 30 between the open situation and the close situation. During said urging, a left side of the first section 705A pushes the first guiding post 56A of the cover 50. The cover 50 is, therefore, urged to move relative to the base 30 along a front-to-back direction until the cover 50 arrives at the close position.

When the lid 60 is over-urged downwardly, the first guiding post 56A (its center point D1 shown in FIG. 8) will enter corresponding second section 707A of the first guiding groove 72A. For the center line 12 of the second section 707A is a regular arc, with the center point of the first pin 71A being the center of the arc, namely, any point of the centerline 12 of the second section 707A has then equal distance from the center point of the first pin 71A, neither side of each second sections 707A actuates said first guiding post 56A. As a result, the cover 50 is kept immovable at the close position. The leads 22 of the IC package 20A will never over-engage or press the second horizontal section 464 of the terminals 40 even if the lid 60 is unduly pressed downwardly or over-urged. Damage to the leads 22 and the terminals 40 due to said over-engagement or pressing is avoided. Thereby reliability of electrical connection between the terminals 40 and the leads 22 is assured.

From the above description, the second guiding groove 72B is defined only to supply space for movement of the second guiding post 56B therein. Further, the second guiding post 56B slide only in the front-to-back direction. Thus, the second guiding groove 72B and the second guiding post 56B may be omitted, or the second guiding grooves 72B have a horizontal configuration only for receiving the second guiding post 56B.

Referring to FIGS. 1, 3, 7 and 9, in order to more efficiently urge the cover 50 to move relative to the base 30, The second guiding groove further includes first and second portion 705B, 707B that are smoothly connected with each other. A center line 13 of the first portion 705B begins from point B1 and terminates at point B2. A center line 14 of the second portion 707B is between point B2 and point B3.

The line 13 is charactered in that from point B1 to B2, the line 13 gradually and radially offsets from a center point of the pin 71B in a plane vertical to a axis of the pin 71B. The whole offset displacement is also devised just equal to a length that the cover 50 moves on the base 30 between the open situation and the close situation.

The line 14 is a formal circle, with the center point of the pin 71B being the center of the circle. Thereby any point of the centerline 14 of the second portion 707B has an equal distance from the center point of the pin 71B.

With the configuration of the second guiding groove 72B, during said urging, a left side of the first portion 705B actuates the second guiding post 56B of the cover 50. The cover 50 is, therefore, urged to move relative to the base 30 along a front-to-back direction until the cover 50 reaches the close position. When the lid 60 is over-urged downwardly, the second guiding post 56B (its center point D2 shown in FIG. 9) enters the second portion 707B. Neither side of each second portions 707B actuates the second guiding posts 56B. As a result, the cover 50 is still kept immovable at the close position. As a result, the cover 50 is efficiently actuated during said urging and kept immovable as the lid is over-urged.

Although the line 11 of the first section has a curve shape in the preferred embodiment, it should be understood that the line 11 may be other shapes such as a slant line, provided that the line 13 of the first portion 705B should be defined to meet the requirement that the second guiding post 56B can smoothly slide in the second guiding groove 72B during movement of the first guiding post 56A.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. A socket comprising:
   an insulative socket body having a bottom wall, said bottom wall defining upper and lower surfaces and a plurality of terminal-passages between the upper and lower surfaces for receiving conductive terminals, respectively;
   a moving plate movably mounted on the upper surface of the bottom wall;
   a lid pivotally attached to the socket body; and
   an urging mechanism provided between the lid and the base and comprising one actuating member, said actuating member being rotatable relative to the socket body around an immovable point as the lid moves downwardly;
   wherein a pair of protrusions are formed on each side of the moving plate, said actuating member defines a guiding groove therein, said guiding groove is dimensioned to fitly receive one of the pair of protrusions and includes first and second sections, a center line of the first section is radially offset from the immovable point of said actuating member, thereby when the lid is continuously pressed down, either of two opposite sides of the first section urges said protrusion to actuate the moving plate to move relative to the socket body between an open position and a close position, whereas a center line of the second section has an arc shape whose common center point is the immovable point of said actuating member, thereby neither of two opposite sides of the second section urges said protrusion and the moving plate is kept immovable as the lid is over-urged;

wherein the center line of the first section has an arc shape; and wherein the first and second sections have a uniform width.

2. The socket as claimed in claim 1, further comprising another actuating member being rotatable relative to the socket body around another immovable point as the lid moves downwardly and defining another guiding groove for engagingly receiving another one of the pair of protrusions as said another actuating member rotates around another immovable point.

3. The socket as claimed in claim 2, wherein the another guiding groove includes first and second portions, when the lid is continuously lifted up or pressed down, either of two opposite sides of the first portion urges said another one of the pair of protrusions to actuate the moving plate to move relative to the socket body between the open position and the close position, whereas neither of two opposite sides of the second portion urges said protrusion as the lid is over urged.

4. The socket as claimed in claim 1, wherein each of the terminals includes a retention portion, a connecting section extending perpendicularly from a lower end of the retention portion, a pair of arms extending horizontally from middles of opposite sides of the retention portion, each of the arms being formed with a first horizontal section, a vertical portion perpendicularly extending from a distal end of the first horizontal section, and a second horizontal section extending horizontally extending from a distal end of the vertical section and wherein two second horizontal sections of the pair of arms have their distal ends extended horizontally apart away from each other.

* * * * *